United States Patent [19]
Liu et al.

[11] Patent Number: 6,002,151
[45] Date of Patent: Dec. 14, 1999

[54] NON-VOLATILE TRENCH SEMICONDUCTOR DEVICE

[75] Inventors: Yowjuang William Liu, San Jose; Yu Sun; Donald L. Wollesen, both of Saratoga, all of Calif.

[73] Assignee: Advanced Micro Devices, Inc., Sunnyvale, Calif.

[21] Appl. No.: 08/993,890

[22] Filed: Dec. 18, 1997

[51] Int. Cl.[6] .......................... H01L 29/76; H01L 29/88; H01L 29/92

[52] U.S. Cl. .......................... 257/316; 257/314; 257/324

[58] Field of Search .................. 257/314–325; 438/257–264, 286

[56] References Cited

U.S. PATENT DOCUMENTS

| | | | |
|---|---|---|---|
| 4,796,228 | 1/1989 | Baglel | 257/321 |
| 4,804,637 | 2/1989 | Smayling et al. | 438/286 |
| 4,868,619 | 9/1989 | Mukherjee et al. | |
| 5,237,188 | 8/1993 | Iwai et al. | 257/325 |
| 5,315,142 | 5/1994 | Acovic et al. | 257/316 |
| 5,392,237 | 2/1995 | Iida | 257/316 |
| 5,486,714 | 1/1996 | Hong | 257/321 |
| 5,506,431 | 4/1996 | Thomas | 227/321 |
| 5,606,521 | 2/1997 | Kuo et al. | 257/314 |
| 5,729,496 | 3/1998 | Jung | 257/321 |
| 5,751,038 | 5/1998 | Mukherjee | 257/316 |
| 5,854,501 | 12/1998 | Kao | 257/316 |

*Primary Examiner*—Minh Loan Tran
*Assistant Examiner*—Cuong Quang Nguyen

[57] ABSTRACT

A non-volatile memory device is formed in a substrate, thereby enabling increased densification. Embodiments include forming a trench in a substrate, forming a substantially U-shaped tunnel dielectric layer in the trench, depositing a substantially U-shaped floating gate electrode on the tunnel dielectric layer, forming a dielectric layer on the floating gate electrode extending on the substrate surface and forming a substantially T-shaped control gate electrode filling the trench and extending on the substrate. Sidewall spacers are formed on side surfaces of the control gate electrode and dielectric layer, followed by ion implantation to form source/drain regions extending into the substrate to substantially the same depth, leaving a region containing an impurity of the first conductivity type at the intersection of the trench and substrate surface which prevents shorting between the source/drain region and gate electrodes.

3 Claims, 2 Drawing Sheets

NON-VOLATILE TRENCH SEMICONDUCTOR DEVICE

RELATED APPLICATIONS

The subject matter involved in the present application is similar to the subject matter involved in copending application Ser. No. 08/992,961 filed on Dec. 17, 1997.

TECHNICAL FIELD

The present invention relates to a non-volatile semiconductor device and to a method for making such a device. The invention has particular applicability in manufacturing very large scale integration and high density non-volatile semiconductor devices with submicron features and active regions isolated by shallow insulated trenches.

BACKGROUND ART

Conventional non-volatile semiconductor devices include various types of flash memory devices, electrically programmable read only memory (EPROM) devices and electrically erasable programmable read only memory (EEPROM) devices. Such conventional types of semiconductor devices are generally characterized by a floating gate and an electrical connection called a control gate, typically fabricated from polycrystalline silicon doped with an appropriate doping material to render the polycrystalline conductive, e.g., phosphorous. The floating gate is separated from a substrate region by a gate dielectric or tunnel dielectric layer of insulating material while the substrate region includes symmetrical or asymmetrical source/drain regions defining a channel region therebetween. The floating gate and control gate are typically separated by a layer of insulating material.

EEPROMs are typically programmed by applying a voltage to the control gate so that electrons or a charge tunnel through the tunnel dielectric layer and stored on the floating gate in a capacitive manner. Erasing is implemented by grounding the control gate and causing electrons or charge to tunnel through the tunnel dielectric layer to the substrate. Typically, electrons tunnel through the tunnel dielectric layer by a phenomenon called "Fowler-Nordheim" tunneling. A conventional EEPROM is disclosed by Mukherjee et al., U.S. Pat. No. 4,868,619 and comprises an asymmetrical drain-source junction as illustrated in FIG. 4.

Adverting to FIG. 4, shallow drain region 54 is formed in substrate 52 at a shallower depth than source region 56. Channel 58 is defined between source 56 and drain 54. Source 56 is a double diffused region comprising a deep phosphorous region 80 and a shallow arsenic region 78. Gate dielectric 60 is formed over channel 58 and extends between drain 54 overlapping a portion 62 of source 56. The gate dielectric 60 is relatively uniformly thin over its entire cross section. Floating gate 64 is formed over gate dielectric 60, and a second dielectric layer 66 is formed over floating gate 64. Control gate 68 is then formed over dielectric layer 66. In operation, programming of the EEPROM depicted in FIG. 4 is achieved by raising the drain 54 and control gate 68 to predetermined potentials above that of the source 56, so that hot electrons 32 are generated and accelerated across the gate dielectric 60 onto floating gate 64. Erasing is achieved by floating the drain node 54, holding the control gate 68 at ground potential, and applying a pulse of high voltage to the source 56. Dielectric layer 66 typically comprises a material having a high dielectric constant, i.e., greater than about 5, such as tantalum pentoxide or silicon nitride. Gate dielectric 60 typically has a thickness of about 100 Å to about 200 Å and comprises an oxynitride. Overlap region 62 is maintained small, e.g., about 0.3 to about 0.4 micrometers. Fowler-Nordheim tunneling requires a very thin dielectric layer, thereby necessitating a gate dielectric 60 thickness of about 100 Å to about 200 Å.

The escalating demands for high densification and performance associated with ultra large scale integration semiconductor devices require design features of 0.25 microns and under, increased transistor and circuit speeds, sharp junctions, high reliability and increased manufacturing throughput for competitiveness. The reduction of design features to 0.25 microns and under generates numerous problems challenging the limitations of conventional semiconductor technology.

Non-volatile semiconductor devices, such as the EEPROM depicted in FIG. 4, occupy a significant amount of precious real estate on a semiconductor substrate and, hence, pose an impediment to miniaturization. Moreover, the protrusion of the gate electrodes above the main surface of a substrate results in the formation of a significant step portion which is difficult to planarize, thereby challenging the depth of focus limitations of conventional photolithographic techniques.

Accordingly, there exists a need for reliable non-volatile semiconductor devices having design features of less than about 0.25 microns. There also exists a need for reliable non-volatile semiconductor devices having substantially uniform topography.

DISCLOSURE OF THE INVENTION

An object of the present invention is a non-volatile semiconductor device having improved device scalability and uniform topography.

Another object of the present invention is a method of manufacturing a non-volatile semiconductor device having improved device scalability and uniform topography.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a substrate having a main surface and containing an impurity of the first conductivity type; a trench, comprising: (a) side surfaces intersecting the main surface at edges and extending into the substrate; and (b) a bottom surface joining the side surfaces at corners within the substrate; a substantially U-shaped tunnel dielectric layer lining the trench; a substantially U-shaped floating gate electrode on the tunnel dielectric layer in the trench; a dielectric layer on the floating gate electrode and extending on the edges and a portion of the main surface terminating in side surfaces; and a control gate electrode having: (a) a first portion extending below the main surface on the dielectric layer in the trench; and (b) a second portion extending on the dielectric layer on the main surface terminating in side surfaces.

Another aspect of the present invention is a method of manufacturing a semiconductor device, which method comprises: forming a trench in a substrate having a main surface and containing an impurity of the first conductivity type, which trench comprises: (a) side surfaces intersecting the main surface at edges and extending into the substrate; and (b) a bottom surface joining the side surfaces at corners within the substrate; forming a substantially U-shaped tunnel dielectric layer lining the trench; forming a substantially U-shaped floating gate electrode on the tunnel dielectric layer in the trench; forming a dielectric layer on the floating gate electrode and extending on the edges and a portion of the main surface terminating in side surfaces; and forming a control gate on the dielectric layer, which control gate comprises: (a) a first portion extending below the main surface on the dielectric layer in the trench; and (b) a second portion extending on the dielectric layer on the main surface terminating in side surfaces.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
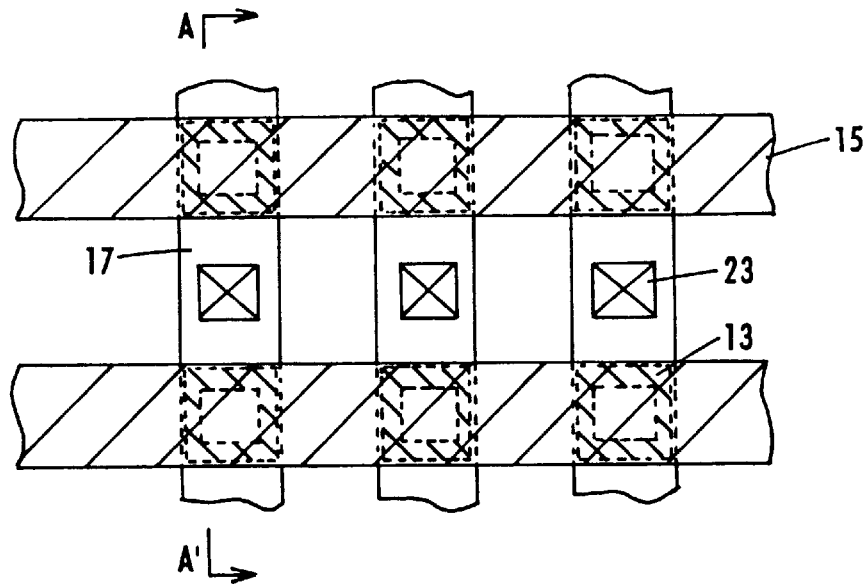
FIG. 1 schematically illustrates a plan view of an embodiment of the present invention.

The present invention addresses and provides an efficient solution to problems generated by the ever increasing demands for high integration and reduced feature sizes by forming a volatile semiconductor device, such as an EEPROM, in a trench formed in a substrate. The formation of an EEPROM in a trench in accordance with the present invention further achieves a substantially uniform planarity or topography, thereby enabling accurate formation of fine features within the capabilities of conventional photolithographic techniques. It was also found that the present invention achieves additional advantages, such as high floating gate coupling ratios for enhanced device performance, larger tunneling areas for erasing and hot carrier programming, with an attendant increase in efficiency, reduction in sensitivity of the control gate alignment, and low source/drain resistance. The present invention is compatible with conventional equipment and achieves a significantly increased denser layout when employed with shallow trench isolation technology. The present invention is applicable to various conventional circuits, exhibits high operating speeds, improved reliability, accuracy and efficiency, a high signal-to-noise ratio, and superior process control at a reduced manufacturing cost.

In accordance with the present invention, a trench is formed in a substrate. As used throughout this application, the term "substrate" denotes a semiconductor substrate, an epitaxial layer formed on a semiconductor substrate or a well region formed in a semiconductor substrate. In various embodiments of the present invention, the trench can be formed in the substrate surface in a conventional manner, e.g., employing conventional trench isolation methodology. The trench formed in the substrate comprises side surfaces, each side surface having an end intersecting the main surface at an edge and another end extending into the substrate and joined by a bottom surface forming corners. A tunnel dielectric layer is then formed to line the trench. Embodiments of the present invention include forming a substantially U-shaped tunnel dielectric layer, typically having a thickness less than about 200 Å, e.g., about 20 Å to about 200 Å. The tunnel dielectric layer can comprise any of various dielectric materials typically employed in conventional EEPROMs as a tunnel dielectric layer, e.g., a nitrided silicon oxide. The tunnel dielectric layer can be formed by thermal oxidation or chemical vapor deposition followed by nitrogen ion implantation or rapid thermal annealing in a nitrogen environment.

After formation of the tunnel dielectric layer, a floating gate electrode is then formed on the tunnel dielectric layer. Embodiments of the present invention include forming a substantially U-shaped floating gate electrode on a substantially U-shaped tunnel dielectric layer.

A dielectric layer is then formed on the floating gate electrode extending on the edges and a portion of the main surface terminating in side surfaces. The dielectric layer can comprise any of various dielectric materials typically formed between the floating gate and control gate in conventional EEPROMs, e.g., a composite stack of silicon oxide/silicon nitride/silicon oxide. A control gate electrode is then formed on the dielectric layer. The control gate electrode has a first portion which extends below the main surface of the dielectric layer in the trench and a second portion extending on the dielectric layer on the main surface terminating side surfaces. Embodiments of the present invention include forming a substantially T-shaped control gate electrode.

Sidewall spacers are then formed on the side surfaces of the dielectric layer and second portion of the control gate electrode. The sidewall spacers can comprise a dielectric material such as silicon nitride or silicon oxynitride.

Ion implantation is then conducted, using the dielectric layer, control gate electrode and sidewall spacers as a mask, to implant an impurity of a conductivity type different from that of the substrate to form source/drain implant regions extending from the main surface into the substrate on opposite side surfaces of the trench. The source/drain implant regions are subsequently activated in a conventional manner by activation annealing to form the active source/drain regions. Embodiments of the present invention include ion implanting to form source/drain regions extending into the substrate to substantially the same depth. A channel region is formed between the source/drain regions which extends along the bottom surface of the trench. An impurity region of the same conductivity type as the substrate is formed under the sidewall spacers during ion implantation at the trench edges and shields the source/drain regions from shorting to the control gate or floating gate.

Embodiments of the present invention include forming a trench having rounded corners to avoid the generation of high electrical fields due to stresses at sharp trench corners. Embodiments of the present invention include rounding the trench corners by forming a sacrificial oxide layer after forming the trench and removing the sacrificial oxide layer, resulting in rounding of the trench corners in the substrate.

Embodiments of the present invention include forming the source/drain region extending just below the trench corners with the channel region formed along the bottom surface of the trench between the source/drain regions. Embodiments of the present invention also include forming source/drain regions extending from the main surface along the opposite side surfaces of the trench to a depth shallower than the trench corners, wherein the channel region extends along the entire bottom surface of the trench, around the trench corners and a short distance along the side surfaces of the trench between the source/drain regions.

Embodiments of the present invention also comprise forming a metal silicide layer, such as tungsten or titanium silicide, on the surface of the control gate and/or the source/drain regions. A dielectric interlayer, such as silicon oxide, is then deposited on the main surface, and a through-hole is formed in the dielectric interlayer exposing the metal silicide layer on the drain region. The through-hole is then filled with conductive material, such as an initial adhesion promoting titanium nitride layer followed by tungsten, to provide electrical contact with the drain region. Copper or aluminum can also be deposited in the through-hole to form the contact. Conventional methodology can be employed to deposit the metal silicide layer and dielectric interlayer, form the through-hole and to fill the through-hole with conductive material.

The present invention is capable of providing non-volatile semiconductor devices, such as EEPROM devices, satisfying the demands for high densification and reduced feature sizes. For example, embodiments of the present invention include forming a trench in a substrate having a width of about 0.05 microns to about 0.5 microns and extending to a depth of about 0.05 microns to about 0.5 microns. The floating gate electrode typically has a uniform thickness of about 100 Å to about 1,500 Å. The first portion of the control gate electrode extends into the substrate on the dielectric layer and typically has a thickness of about 100 Å to about 1,500 Å; while the second portion of the control gate electrode extends on the substrate surface and typically has a thickness of about 1,000 Å to about 3,000 Å. Embodiments of the present invention include forming sidewall spacers typically having a thickness of about 100 Å to about 2,000 Å.

Embodiments of the present invention also including forming asymmetric source/drain regions. Typically, the source region comprises a double diffused implantation region including a first impurity region and a second impurity region extending below the first impurity region and containing an impurity having a higher diffusivity in the substrate than the impurity in the first region. For example, the source and drain regions can be initially implanted with arsenic to a relatively shallow depth, e.g., 0.05 microns to about 0.5 microns. Such an initial implantation is preferably performed with multiple implantation steps. The drain region is then masked and phosphorous is implanted into the source region. As phosphorous has a higher diffusivity than arsenic, during conventional activation annealing, phosphorous will diffuse to a greater depth than arsenic. The procedure disclosed by Mukherjee et al. in U.S. Pat. No. 4,868,619 can be employed in forming asymmetric source/drain regions.

Figure 2:
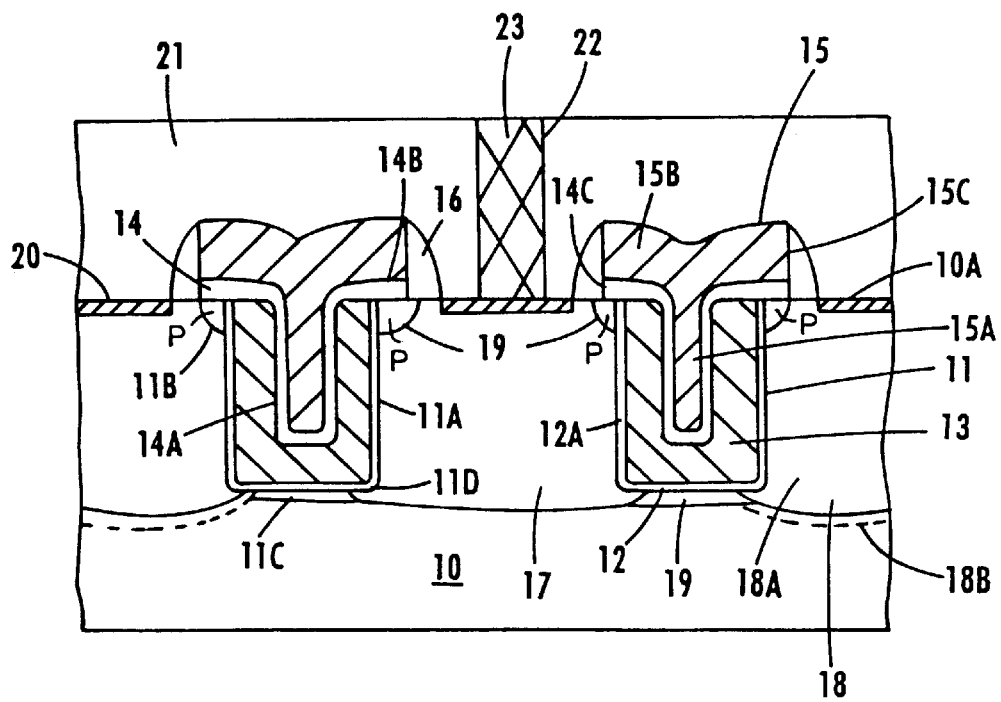
FIG. 2 is a cross sectional view taken along line A–A' of FIG. 1.

An embodiment of the present invention is illustrated in FIGS. 1 and 2, wherein FIG. 2 is a cross sectional view taken along line A–A' of the plan view illustrated in FIG. 1. Adverting to FIGS. 1 and 2, trenches 11 are formed in substrate 10, e.g., a semiconductor substrate such as monocrystalline silicon doped with a P-type impurity. Each trench 11 comprises side surfaces 11A intersecting main surface 10A at edges 11B, extending into substrate 10 and joined by bottom surface 11C at corners 11D. Trenches 11 can be formed in a conventional manner as, for example, employing a conventional reactive ion etching technique as in forming trench isolation. Each trench 11 is formed at appropriate dimensions consistent with the device design rule, e.g., having a width of about 0.05 microns to about 0.5 microns and a depth into the substrate of about 0.05 microns to about 0.5 microns.

Embodiments of the present invention include conducting a thermal oxidation step after trench formation to form a sacrificial oxide liner having a thickness of about 50 Å to about 500 Å, during which substrate material is consumed at a horizontal oxidation rate greater than the vertical oxidation rate, thereby rounding the trench corners. The sacrificial oxide layer is then removed. The rounded trench corners prevent the generation of a high electric field at trench corners, which would occur with sharp trench corners, thereby improving device performance.

After forming the trench with rounded corners, a tunnel dielectric layer 12 is formed lining the trench in the substrate. Embodiments of the present invention include forming a tunnel dielectric layer 12 by thermal oxidation at a temperature of about 1,000° C. or higher. As tunnel dielectric layer 12 lines the trench, it is generally formed in a substantially U-shaped configuration. Embodiments of the present invention further include formation of spacer 12A having a thickness greater than that of tunnel dielectric layer 12, so that the dielectric layer at the bottom portion of the trench functions as the tunnelling dielectric layer. This can be implemented by depositing a conformal dielectric layer and then conducting anisotropic reactive ion etching.

Floating gate electrode 13 is then formed on tunnel dielectric layer 12 in a substantially U-shaped configuration. Floating gate electrode 13 typically comprises doped polycrystalline silicon and is typically formed by depositing a conformal layer of doped polycrystalline silicon, as by chemical vapor deposition, wherein the deposited polycrystalline silicon layer generally conforms to the substantially U-shaped opening of the trench lined with the substantially U-shaped tunnel dielectric layer 12. Etching is then conducted followed by planarization, as by chemical mechanical polishing, such that tunnel dielectric layer 12 and floating gate electrode 13 are substantially flush with main surface 10A of substrate 10.

Dielectric layer 14 is then formed on floating gate electrode 13. Dielectric layer 14 typically comprises a first substantially U-shaped portion 14A which lines the exposed portion of floating gate electrode 13 extending into substrate 10, and a second portion 14B which extends on the trench edges 11B and a portion of the main surface 10A terminating in side surfaces 14C. Control gate electrode 15, typically comprising doped polycrystalline silicon, is then formed. Control gate electrode 15 comprises a substantially vertically extending portion 15A filling the trench and a substantially horizontally extending portion 15B extending on second portion 14B of dielectric layer 14 terminating in side surfaces 15C, generally substantially coplanar with side surfaces 14C of dielectric layer 14.

In addition, employing dielectric layer portion 14B and control gate portion 15B as a mask, ion implantation is conducted to form an impurity region 19 at the trench edges extending from main surface 10A into substrate 10 entirely within source/drain regions 18/17. Impurity region 19, having a P-type conductivity, shields source/drain junctions from floating gate electrode 13 and control gate electrode 15. Sidewall spacers 16 are formed on side surfaces 15C of control gate electrode 15 and 14C of dielectric layer 14. Using dielectric portion 14B, control gate portion 15B and sidewall spacers 16 as a mask, ion implantation(s) is then conducted to form drain implant region 17 and first source implant subregions 18A of source region 18 by implantation of an N-type impurity, such as arsenic. Drain region 17 is then masked and an N-type impurity having a diffusivity faster than arsenic, such as phosphorous is ion implanted. Upon subsequent activation annealing, the phosphorous implant forms second source sub-regions 18B of source region 18 extending to a depth greater than the first source subregion 18A, thereby forming asymmetric source/drain regions. Drain region 17 and first source sub-regions 18A generally extend into the substrate to substantially the same depth, e.g., the trench depth. Upon formation of source/drain regions 17, 18, channel region 19 is formed along the bottom surface 11C of trench 11 between drain region 17 and source region 18.

Silicide layers 20, typically a refractory metal silicide such as tungsten or titanium silicide, are then formed on source/drain regions 18/17 in a conventional manner, as by deposition of the metal silicide or by deposition of the metal followed by heating to effect reaction between the deposited metal and underlying silicon. In other embodiments, a metal silicide layer is formed on control gate electrode 15 (not shown in the FIG. 2 embodiment) in addition to forming metal silicide layers on source/drain regions 18/17.

A dielectric interlayer 21 is then formed on main surface 10A and a through-hole 22 formed therein. Through-hole 22 exposes a surface portion of metal silicide layer 20 on drain region 17. Through-hole 22 is then filled with conductive material 23, such as copper, aluminum or tungsten, in a conventional manner.

Figure 3:
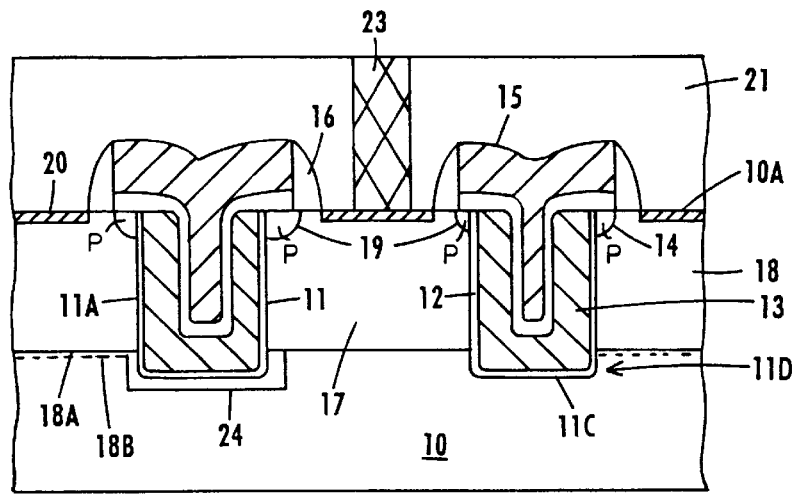
FIG. 3 illustrates another embodiment of the present invention.
Figure 4:
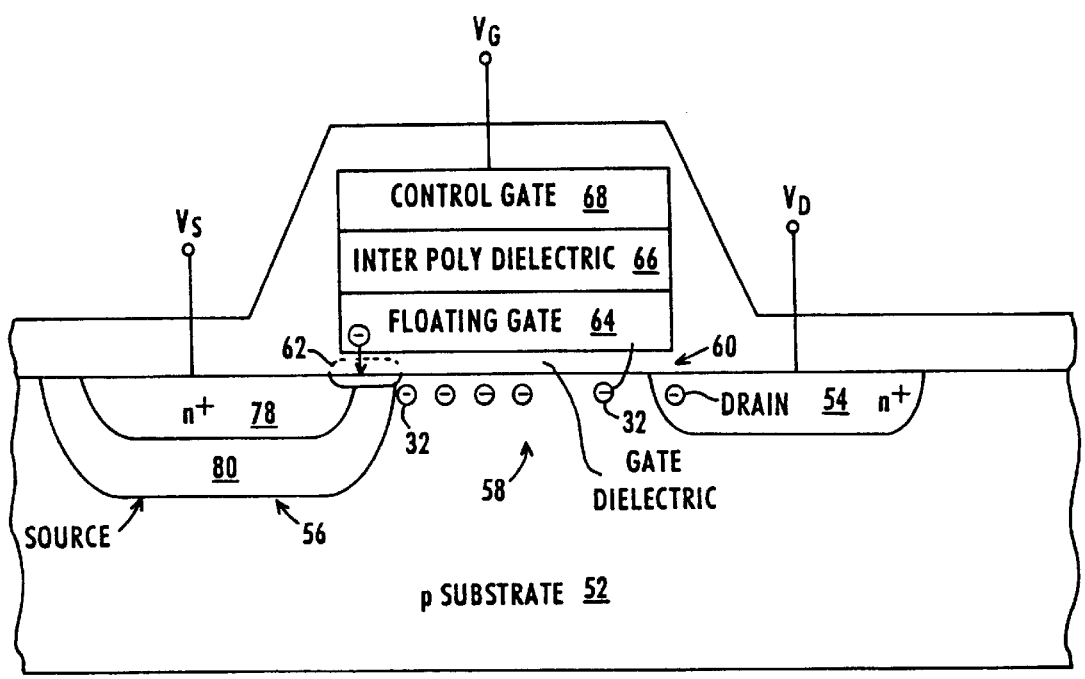
FIG. 4 illustrates a conventional EPROM with an asymmetric drain/source junction.

Another embodiment of the present invention is schematically illustrated in FIG. 3, wherein elements similar to those in FIG. 2 bear similar reference numerals. The embodiment depicted in FIG. 3 is similar to the embodiment depicted in FIG. 2 and, to the extent of such similarity, features are not described in detail. The FIG. 3 embodiment differs from the FIG. 2 embodiment in that source/drain regions 18/17 are formed to a shallower depth and do not extend to trench corners 11D. Thus, in the FIG. 3 embodiment, channel region 24 extends along bottom surface 11C of trench 11, around trench corners 11D and along a portion of side surfaces 11A between source/drain regions 18/17. In the embodiment depicted in FIG. 3, the channel region is lengthened, thereby providing the additional advantage of avoiding the short channel effect. Moreover, in the embodiment depicted in FIG. 3, it is possible to have a negative or intrinsic threshold voltage.

The present invention enables the formation of non-volatile semiconductor devices, such as EPROMs and EEPROMs, having reduced feature sizes and, hence, significantly enhances integration and high densification, particularly in semiconductor devices having a design rule of about 0.25 microns and under. Semiconductor devices produced in accordance with the present invention have higher floating gate coupling ratios for enhanced device performance, larger tunneling areas for improved efficiency in programming and erasing, and low source/drain resistances. Significantly the semiconductor devices of the present invention are characterized by gate electrode stacks with improved planar topography at the front and back ends during processing, thereby enabling the use of conventional photolithographic techniques to form fine feature sizes without challenging inherent depth of focus limitations. The present invention provides denser layouts by employing conventional trench isolation in combination with the non-volatile trench devices of the present invention. The semiconductor devices produced in accordance with the present invention are applicable to any of various types of circuitry. Thus, the present invention improves densification, increases operating speed, improves reliability, accuracy, efficiency and the signal-to-noise ratio, enables superior process control and reduces manufacturing costs, thereby providing a competitive advantage. The present invention can be employed in manufacturing various types of semiconductor devices.

The present invention can be practiced by employing conventional materials, methodology and equipment. Accordingly, the details of such materials, equipment and methodology are not set forth herein in detail. The present invention is applicable to the production of various types of semiconductor devices, and enjoys particular utility in the production of semiconductor devices containing flash memory devices and having a design rule less than about 0.25 microns.

In the previous descriptions, numerous specific details are set forth, such as specific materials, dimensions, structures, chemicals, processes, parameters, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising:
   a substrate having a main surface and containing an impurity of the first conductivity type;
   a trench, comprising:
   (a) side surfaces having edges intersecting the main surface, the side surfaces extending into the substrate; and
   (b) a bottom surface joining the side surfaces at corners within the substrate;
   a substantially U-shaped tunnel dielectric layer lining the trench;
   a substantially U-shaped floating gate electrode on the tunnel dielectric layer in the trench;
   a dielectric layer on the floating gate electrode and extending on the edges and a portion of the main surface, the dielectric layer having side surfaces on the main surface;
   a control gate electrode having:
   (a) a first portion extending below the main surface on the dielectric layer in the trench; and
   (b) a second portion extending on the dielectric layer on the main surface and having side surfaces;
   a channel region in the substrate along the bottom surface of the trench;
   source/drain regions containing an impurity of the second conductivity type and extending from the main surface into the substrate on opposite side surfaces of the trench, wherein the channel region extends between the source/drain regions;

sidewall spacers on the side surfaces of the dielectric layer and second portion of the control gate electrode; and an impurity region of the first conductivity type extending from the main surface at each trench edge into the substrate and entirely within the source/drain region; wherein;

each of the source/drain regions extends into the substrate to substantially the same death.

2. The semiconductor device according to claim 1, further comprising a metal silicide layer on the source/drain regions.

3. The semiconductor device according to claim 2, further comprising:

a dielectric interlayer on the main surface;

a through-hole in the dielectric interlayer exposing the metal silicide layer on the drain region; and a contact plug filling the through-hole and in electrical contact with the drain region.

* * * * *